(12) United States Patent
Nishina et al.

(10) Patent No.: US 8,994,324 B2
(45) Date of Patent: Mar. 31, 2015

(54) CHARGE CAPACITY PARAMETER ESTIMATION SYSTEM OF ELECTRIC STORAGE DEVICE

(75) Inventors: Masatoshi Nishina, Wako (JP); Naoya Hayashida, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 444 days.

(21) Appl. No.: 13/610,001

(22) Filed: Sep. 11, 2012

(65) Prior Publication Data

US 2013/0099727 A1   Apr. 25, 2013

(30) Foreign Application Priority Data

Oct. 25, 2011  (JP) .................................. 2011-233560

(51) Int. Cl.
   *H02J 7/00* (2006.01)
   *H02J 7/04* (2006.01)
   *H02J 7/14* (2006.01)
   *G01R 31/36* (2006.01)
(52) U.S. Cl.
   CPC . *H02J 7/042* (2013.01); *H02J 7/14* (2013.01); *G01R 31/3648* (2013.01); *Y02T 10/7005* (2013.01)
   USPC ......................................................... 320/107
(58) Field of Classification Search
   USPC ......................................................... 320/107
   See application file for complete search history.

(56) References Cited

U.S. PATENT DOCUMENTS

| 5,896,023 A | 4/1999 | Richter |
| 8,026,698 B2 * | 9/2011 | Scheucher ..................... 320/136 |
| 2004/0257045 A1 | 12/2004 | Sada |
| 2012/0229077 A1 * | 9/2012 | Tsuchiya ....................... 320/107 |

FOREIGN PATENT DOCUMENTS

| JP | 08-339835 | 12/1996 |
| JP | 2003-007353 | 1/2003 |
| JP | 2006-333553 | 12/2006 |
| WO | 2005/111642 | 11/2005 |

OTHER PUBLICATIONS

Japanese Office Action dated Aug. 27, 2013, 2 pages.

* cited by examiner

*Primary Examiner* — Suresh Memula
(74) *Attorney, Agent, or Firm* — Rankin, Hill & Clark LLP (57) ABSTRACT

A charge capacity parameter estimation system for an electric storage device capable of charging and discharging is provided, which can accurately estimate a charge capacity parameter indicative of a charge capacity of the electric storage device. The charge capacity parameter estimation system for a battery includes an ECU and a sensor unit. The ECU estimates that an actual charge capacity of the electric storage device is less than an estimated charge capacity, when a charging state of the electric storage device is detected, in a case where a generated voltage of a power generator is controlled such that the battery executes a discharging operation to an auxiliary equipment.

4 Claims, 9 Drawing Sheets

| TBAT<br>VBATave | TBAT1 | ········· | TBATj |
|---|---|---|---|
| VBATave1 | What11 | ········· | What1j |
| ⋮ | ⋮ | | ⋮ |
| VBATavei | Whati1 | ········· | Whatij |

CHARGE CAPACITY PARAMETER ESTIMATION SYSTEM OF ELECTRIC STORAGE DEVICE

BACKGROUND OF THE INVENTION

1. Field of the Invention

The present invention relates to a charge capacity parameter estimation system for an electric storage device capable of charging and discharging, which estimates a charge capacity parameter indicative of a charge capacity of the electric storage device.

2. Description of the Related Art

Conventionally, as an estimating device that estimates the capacity of an electric storage device, there has been proposed one disclosed in a Japanese Laid-Open Patent Publication (Kokai) No. H08-339835. The estimating device estimates a remaining capacity as the capacity of the electric storage device, and includes a controller and a current detection circuit that detects electric current flowing from the electric storage device to a load.

In this estimating device, as shown FIG. 4 of Japanese Laid-Open Patent Publication (Kokai) No. H08-339835, when the electric storage device is connected to the controller, a remaining capacity CA is set as an initial value (100%). Then, when a discharging operation of the electric storage device is executed, a dischargeable capacity Ci and an actual discharged capacity CH which is actually discharged in one control period are calculated based on a discharge current I. A percentage CB of the actual discharged capacity CH to the dischargeable capacity Ci is calculated, and then the percentage CB is subtracted from the remaining capacity CA, whereby the remaining capacity CA is calculated, i.e. updated.

According to the above-mentioned estimating device, the remaining capacity CA is calculated by a method of first setting the remaining capacity CA to the initial value (100%), and then, whenever the discharging operation of the electric storage device is executed, subtracting a dropped amount of the remaining capacity caused by the discharging operation. Therefore, when the method is applied to an electric storage device that repeats charging and discharging operations, such as a rechargeable battery, there is a problem that a charged electric quantity cannot be accurately reflected on the remaining capacity CA, so that the remaining capacity CA cannot be accurately calculated.

SUMMARY OF THE INVENTION

It is an object of the present invention to solve the above-described problem, and to provide a charge capacity parameter estimation system for an electric storage device capable of charging and discharging, which can accurately estimate a charge capacity parameter indicative of a charge capacity of the electric storage device.

To attain the above object, in a first aspect of the present invention, there is provided a charge capacity parameter estimation system which estimates a charge capacity parameter indicative of a charge capacity of an electric storage device that is electrically connected to a power generator of which a generated voltage is controlled by a control device, and to an electric device to which generated voltage is supplied from the power generator, the electric storage device being controlled in respect of a charging operation from the power generator and a discharging operation to the electric device according to the charge capacity parameter indicative of the charge capacity, through control of the generated voltage of the power generator by the control device, the charge capacity parameter estimation system comprising charging/discharging state detection means for detecting a charging/discharging state of the electric storage device, and estimation means for estimating that an actual charge capacity of the electric storage device is less than the charge capacity indicated by the charge capacity parameter, when the charging state of the electric storage device is detected, in a case where the generated voltage of the power generator is controlled such that the electric storage device executes the discharging operation to the electric device.

According to the charge capacity parameter estimation system for the electric storage device, it is estimated that the actual charge capacity of the electric storage device is less than the charge capacity indicated by the charge capacity parameter, when the charging state of the electric storage device is detected in a case where the generated voltage of the power generator is controlled such that the electric storage device executes the discharging operation to the electric device. In the electric storage device, through the control of the generated voltage of the power generator by the control device, a charging operation from the power generator and a discharging operation to the electric device are controlled according to the charge capacity parameter, and hence in the case where the generated voltage of the power generator is controlled such that the electric storage device executes the discharging operation to the electric device, the charge capacity indicated by the charge capacity parameter at the time is estimated to be a suitable value for executing the discharging operation. When the charging state of the electric storage device is detected despite the estimate, it can be estimated that the actual charge capacity of the electric storage device is less than the charge capacity indicated at the time by the charge capacity parameter. Thus, it is possible to accurately estimate that the actual charge capacity of the electric storage device is less than the charge capacity indicated by the charge capacity parameter.

Preferably, when the estimation means estimates that the actual charge capacity of the electric storage device is less than the charge capacity indicated by the charge capacity parameter, the control device executes charging control for controlling the generated voltage of the power generator, such that the charge capacity indicated by the charge capacity parameter is increased by a predetermined value through the charging operation to the electric storage device, and when the charging control is terminated, the estimation means corrects the charge capacity parameter such that the charge capacity indicated by the charge capacity parameter is reduced by the predetermined value.

According to this preferred embodiment, when it is estimated that the actual charge capacity of the electric storage device is less than the charge capacity indicated by the charge capacity parameter, the charging control for controlling the generated voltage of the power generator is executed such that the charge capacity indicated by the charge capacity parameter is increased by the predetermined value through the charging operation to the electric storage device. And, when the charging control is terminated, the charge capacity parameter is corrected such that the charge capacity indicated by the charge capacity parameter is reduced by the predetermined value, and hence by appropriately setting the predetermined value, the charge capacity indicated by the estimated charge capacity parameter can be made closer to the actual charge capacity of the electric storage device, whereby it is possible to improve estimation accuracy of the charge capacity parameter.

Preferably, when the estimation means estimates that the actual charge capacity of the electric storage device is less than the charge capacity indicated by the charge capacity parameter, the estimation means corrects the charge capacity parameter such that the charge capacity indicated by the charge capacity parameter is reduced by the predetermined value, and when the estimation means executes the correction of the charge capacity parameter, the control device controls the generated voltage of the power generator such that the charge capacity indicated by the charge capacity parameter is increased by the predetermined value through the charging operation to the electric storage device.

According to this preferred embodiment, when it is estimated that the actual charge capacity of the electric storage device is less than the charge capacity indicated by the charge capacity parameter, the charge capacity parameter is corrected such that the charge capacity indicated by the charge capacity parameter is reduced by the predetermined value. And when the correction of the charge capacity parameter is executed, the generated voltage of the power generator is controlled such that the charge capacity indicated by the charge capacity parameter is increased by the predetermined value through the charging operation to the electric storage device. Therefore, by appropriately setting the predetermined value, it is possible to make the charge capacity indicated by the estimated charge capacity parameter closer to the actual charge capacity of the electric storage device, whereby it is possible to improve the estimation accuracy of the charge capacity parameter.

In a second aspect of the present invention, there is provided a charge capacity parameter estimation system which estimates a charge capacity parameter indicative of a charge capacity of an electric storage device that is electrically connected to a power generator of which a generated voltage is controlled by a control device, and to an electric device to which generated voltage is supplied from the power generator, the electric storage device being controlled in respect of a charging operation from the power generator and a discharging operation to the electric device, through control of the generated voltage of the power generator by the control device, the charge capacity parameter estimation system comprising current detection means for detecting a current flowing during a charging/discharging operation of the electric storage device, voltage detection means for detecting a voltage of the electric storage device, and estimation means for estimating the charge capacity parameter, using a correlation model representing a correlation between the voltage of the electric storage device and the charge capacity parameter, based on the voltage of the electric storage device detected when the current flowing to or from the electric storage device is held in a predetermined range around 0 by the control of the generated voltage of the power generator.

According to the charge capacity parameter estimation system for the electric storage device, the charge capacity parameter is estimated using a correlation model representing a correlation between the voltage of the electric storage device and the charge capacity parameter, based on a voltage of the electric storage device, which is detected when the electric current flowing to or from the electric storage device is held in a predetermined range around 0 by the control of the generated voltage of the power generator. In this case, the voltage of the electric storage device, which is detected when the electric current flowing to or from the electric storage device is held in a predetermined rage around 0, can be regarded to be close to an open circuit voltage of the electric storage device. Therefore, by using such voltage, it is possible to accurately estimate the charge capacity parameter even during power generating operation of the power generator.

The above and other objects, features, and advantages of the present invention will become more apparent from the following detailed description taken in conjunction with the accompanying drawings.

DETAILED DESCRIPTION OF PREFERRED EMBODIMENTS

Figure 1:
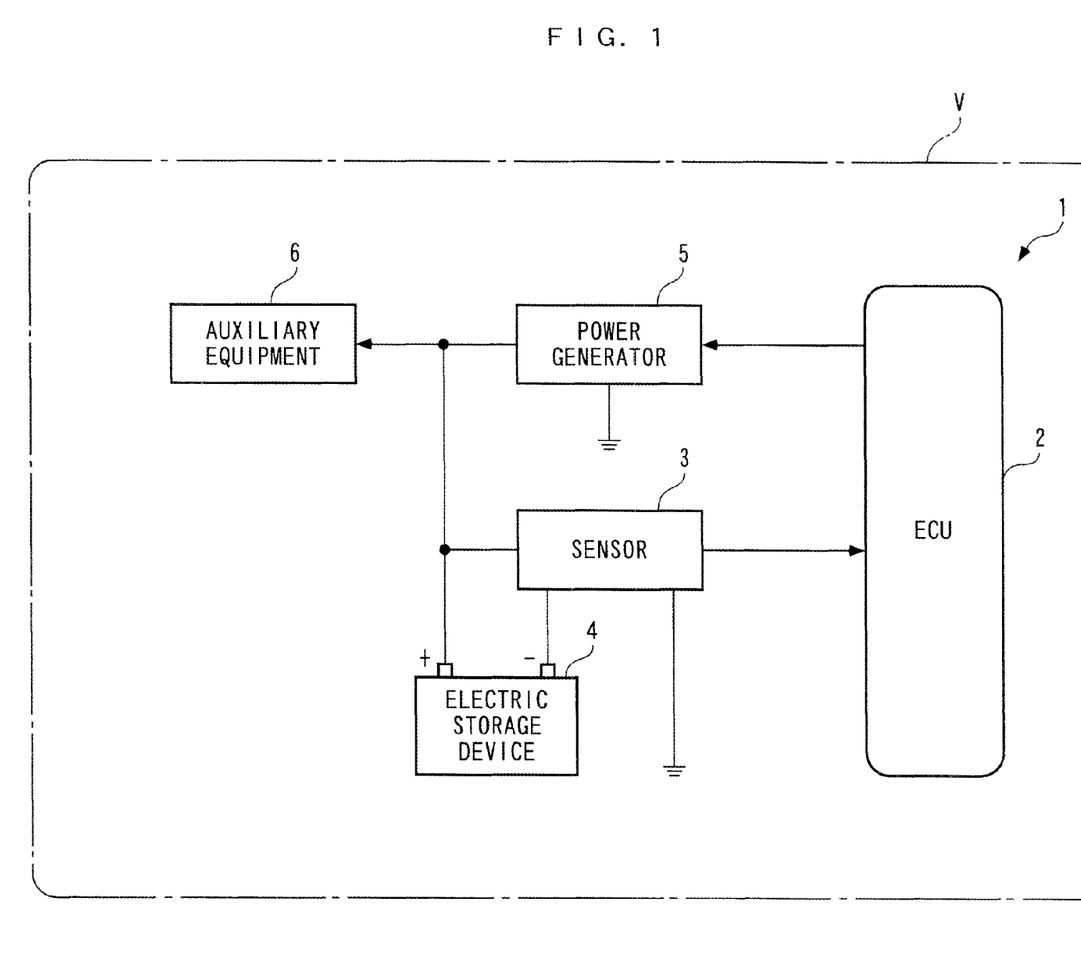
FIG. 1 is a schematic diagram showing a configuration of a charge capacity parameter estimation system for an electric storage device, according to a first embodiment of the present invention.

Hereinafter, a charge capacity parameter estimation system for an electric storage device, according to a first embodiment of the present invention, will be described with reference to drawings. As shown in FIG. 1, the charge capacity parameter estimation system 1 includes an ECU 2 and a sensor unit 3, both of which are mounted on a vehicle V. The ECU 2 is electrically connected to the sensor unit 3 and a power generator 5, and executes various control process, including a power generation control process, as described hereinafter.

On the vehicle V, a battery 4 as the electric storage device, the power generator 5, auxiliary equipment 6, and so forth are installed. The battery 4 is a lead-acid type, and is electrically connected to the power generator 5 and the auxiliary equipment 6. In the case of the battery 4, as described hereinafter, a generated voltage of the power generator 5 is controlled by the ECU 2, whereby the charge capacity as a charge capacity parameter is controlled. The charge capacity corresponds to an electric quantity (unit: Ah) which can be taken out from the battery 4 before the voltage of the battery 4 reaches a final voltage in the case where the battery 4 is held in a discharging state.

Further, the power generator 5 is a combination of an alternating current generator, not shown, and a control circuit (not shown) for controlling the alternating current generator. The alternating current generator is mechanically linked to an engine (not shown) of the vehicle V, and configured to generate electricity when being driven by the motive power of the engine. Further, the control circuit is electrically connected to the ECU 2, and when a command signal is input from the ECU 2, the control circuit controls the generated voltage of the alternating generator such that a required voltage VACG indicated by the command signal is generated as described hereinafter. In short, power generation by the power generator 5 is executed. At this time, an electric current flows from the power generator 5 to the auxiliary equipment 6 and also flows to the battery 4 when the charge capacity of the battery 4 is low.

Further, the auxiliary equipment 6 (electric device) comprises an air conditioner, an audio device, and so forth, and operates by power supply from the power generator 5 and/or the battery 4.

On the other hand, the sensor unit 3 (charging/discharging state detection means) is a combination of a sensor element and an electric circuit (none of which are shown), and detects a battery current IBAT, a battery terminal voltage VBAT, and a battery temperature TB, and output respective detection signals indicative of them to the ECU 2. The battery temperature TB indicates the temperature of the battery 4, and the battery terminal voltage VBAT indicates a voltage between the output terminals of the battery 4.

Further, the battery current IBAT is electric current flowing between the battery 4 and the power generator 5, or between the battery 4 and the auxiliary equipment 6, and is detected as a positive value when flowing from the power generator 5 to the battery 4, i.e. the battery 4 is in a charging state, and is detected as a negative value when flowing from the battery 4 to the auxiliary equipment 6, i.e. the battery 4 is in the discharging state.

Further, the ECU 2 is formed by a microcomputer comprising a CPU, a RAM, a ROM, and an I/O interface (none of which are shown), and executes various control processes based on detection signals of the sensor unit 3 and so forth. Specifically, as described hereinafter, the ECU 2 executes a power generation control process, an estimated charge capacity calculation process, a charge capacity determination process, and so forth. Note that in the present embodiment, the ECU 2 corresponds to a control device and estimation means.

Next, the power generation control process executed by the ECU 2 will be described with reference to FIG. 2. This process is for controlling the generated voltage of the power generator 5, and is executed at a predetermined control period $\Delta T$ (10 msec, for example). Note that various values calculated or set in the following description are assumed to be stored in the RAM of the ECU 2.

Figure 2:
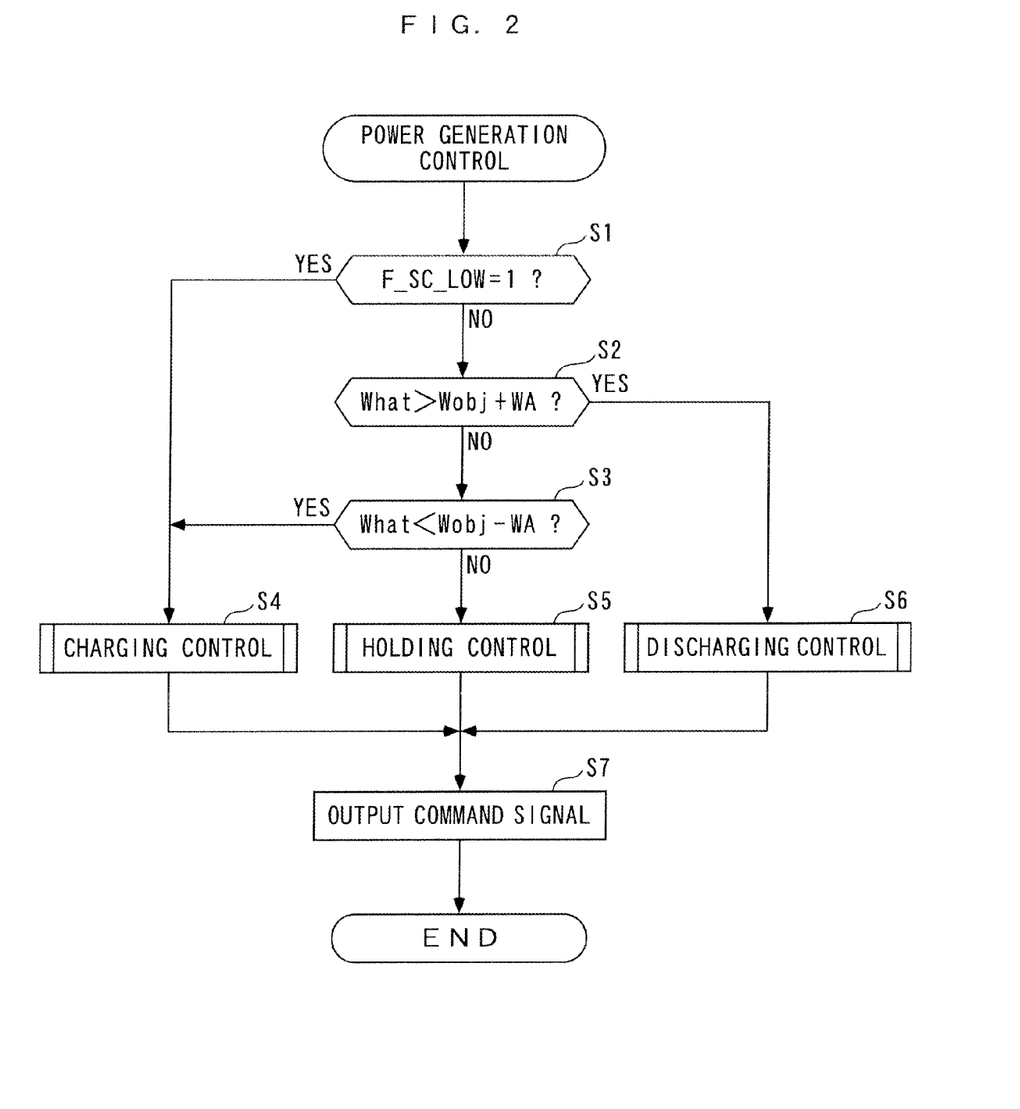
FIG. 2 is a flowchart showing a power generation control process.

As shown in FIG. 2, first, in a step 1 (shown as S1 in abbreviated form in FIG. 2; the same shall apply hereinafter), it is determined whether or not a low capacity flag F_SC_LOW is 1. The low capacity flag F_SC_LOW is set, in the charge capacity determination process described hereinafter, based on whether or not an actual charge capacity of the battery 4 is less than an estimated charge capacity What which is an estimated value of the charge capacity.

If the answer to the question of the step 1 is affirmative (YES), i.e. if it is determined that the actual charge capacity of the battery 4 is less than the estimated charge capacity What, it is determined that charging of the battery 4 should be executed, and the process proceeds to a step 4, wherein a charging control process is executed. In the charging control process, under normal conditions, a demand voltage VACG is set at each control timing such that it is gradually increased to a predetermined charge value Vchg, and is held at the predetermined charge value Vchg after it is reached. Note that when conditions for rapidly charging the battery 4 are satisfied, at the first control timing, the demand voltage VACG is set to the predetermined charge value Vchg.

Next, the process proceeds to a step 7, wherein the command signal indicative of the demand voltage VACG, which is calculated in the step 4, is output to the power generator 5, followed by terminating the present process. This controls the generated voltage of the power generator 5 such that it is increased to the predetermined charge value Vchg, whereby electric current is caused to flow from the power generator 5 to the battery 4, to execute charging of the battery 4.

On the other hand, if the answer to the question of the step 1 is negative (NO), i.e. if F_SC_LOW=0, the process proceeds to a step 2, wherein it is determined whether or not the estimated charge capacity What is larger than the sum Wobj+WA of a predetermined target charge capacity Wobj and a predetermined value WA. The estimated charge capacity What is an estimated value of the charge capacity of the battery 4, and is calculated as described hereinafter. Further, the predetermined target charge capacity Wobj is a target value of the estimated charge capacity What, and is set to, for example, a value which is approximately 80% of a charge level SOC (state-of-charge) of the battery 4. Further, the predetermined value WA is set to a predetermined positive value close to 0.

If the answer to the question of the step 2 is affirmative (YES), i.e. if What>Wobj+WA, it is determined that the battery 4 should be controlled to be in the discharging state, and the process proceeds to a step 6, wherein a discharging control process is executed. In the discharging control process, the demand voltage VACG is set at each control timing such that it is gradually reduced to a predetermined discharge value Vdschg, and is held at the predetermined discharge value Vdschg after it is reached.

Next, the process proceeds to the step 7, wherein the command signal indicative of the demand voltage VACG, which is calculated in the step 6, is output to the power generator 5, followed by terminating the present process. This controls the generated voltage of the power generator 5 such that it is gradually reduced to the predetermined discharge value Vdschg, and is held at the discharge value Vdschg after it is reached. As a consequence, electric current flows from the battery 4 to the auxiliary equipment 6, which places the battery 4 in the discharging state.

On the other hand, if the answer to the question of the step 2 is negative (NO), the process proceeds to a step 3, wherein it is determined whether or not the estimated charge capacity What is less than a value Wobj −WA. If the answer to this question is affirmative (YES), i.e. if What<Wobj−WA, it is determined that charging of the battery 4 should be executed, and the steps 4 and 7 are executed as described above, followed by terminating the present process.

On the other hand, if the answer to the question of the step 3 is negative (NO), which means that Wobj−WA≤What≤Wobj+WA, i.e. if What≈Wobj holds, it is determined that the charge capacity of the battery 4 should be held, and the process proceeds to a step 5, wherein a hold control process is executed. In the hold control process, the demand voltage VACG is set such that the state of What≈Wobj is held. By thus setting the demand voltage VACG, the estimated charge capacity What is held such that What≈Wobj holds. As a consequence, assuming that a predetermined value Ia satisfies Ia>0 and Ia≈0, the battery current IBAT is held at a value in a predetermined range (−Ia≤IBAT≤Ia) in the vicinity of 0.

Next, the process proceeds to the step 7, wherein the command signal indicative of the demand voltage VACG, which is set in the step 5, is output to the power generator 5, followed by terminating the present process.

Next, the charge capacity determination process executed by the ECU 2 will be described with reference to FIG. 3. In this process, it is determined whether or not the actual charge capacity of the battery 4 is less than the estimated charge capacity What, and based on the result of the determination, a value of the low capacity flag F_SC_LOW is set. The process is executed at the above-mentioned predetermined control period ΔT.

Figure 3:
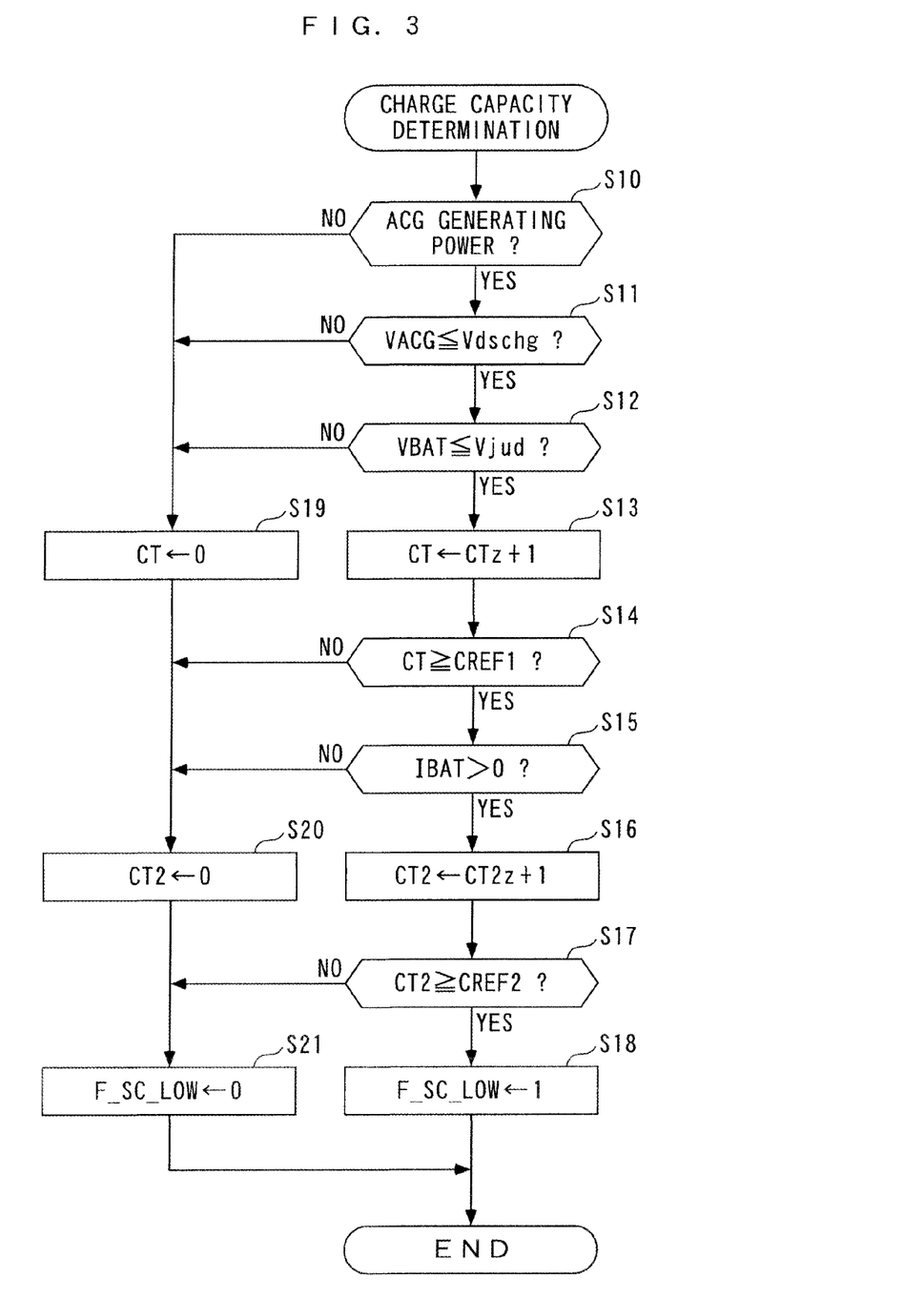
FIG. 3 is a flowchart showing a charge capacity determination process.

As shown in FIG. 3, first, in a step 10, it is determined whether or not the power generator 5 (shown as ACG in FIG. 3; the same shall apply hereinafter) is generating electric power. If the answer to this question is negative (NO), in steps 19 and 20, a count value CT of a discharging state counter and a count value CT2 of a charge continuation counter are both set to 0, then in a step 21, the low capacity flag F_SC_LOW is set to 0, followed by terminating the present process.

On the other hand, if the answer to the question of the step 10 is affirmative (YES), i.e. if the power generator 5 is generating electric power, the process proceeds to a step 11, wherein it is determined whether or not the demand voltage VACG is lower than the above-mentioned predetermined discharge value Vdschg. If the answer to this question is negative (NO), the steps 19 to 21 are executed as described above, followed by terminating the present process.

On the other hand, if the answer to the question of the step 11 is affirmative (YES), i.e. if VACGV≤Vdschg holds by executing the above-mentioned discharging control process, the process proceeds to a step 12, wherein it is determined whether or not the battery terminal voltage VBAT is lower than a predetermined discharge reference value Vjud. If the answer to this question is negative (NO), the steps 19 to 21 are executed as described above, followed by terminating the present process.

On the other hand, if the answer to the question of the step 12 is affirmative (YES), the process proceeds to a step 13, wherein the count value CT of the discharging state counter is set to the sum (CTz+1) of the immediately preceding value CTz and 1. That is, the count value CT of the discharging state counter is incremented by 1. The discharging state counter is for counting time during which the battery terminal voltage VBAT is held below the predetermined discharge reference value Vjud during execution of the above-described discharging control process.

In a step 14 following the step 13, it is determined whether or not the count value CT of the discharging state counter is larger than a predetermined value CREF1. If the answer to this question is negative (NO), the steps 19 to 21 are executed as described above, followed by terminating the present process.

On the other hand, if the answer to the question of the step 14 is affirmative (YES), i.e. if the time during which the battery terminal voltage VBAT is held below the predetermined discharge reference value Vjud has reached a value ΔT·CREF1, the process proceeds to a step 15, and it is determined whether or not the battery current IBAT is larger than 0. If the answer to this question is negative (NO), i.e. if the battery 4 is not in the charging state, it is determined that the actual charge capacity of the battery 4 is in a state close to the estimated charge capacity What, and the steps 19 to 21 are executed as described above, followed by terminating the present process.

On the other hand, if the answer to the question of the step 15 is affirmative (YES), i.e. if the battery 4 is in the charging state, the process proceeds to a step 16, wherein the count value CT2 of the charge continuation counter is set to the sum (CT2z+1) of the immediately preceding value CT2z and 1. That is, the count value CT2 of the charge continuation counter is incremented by 1. The charge continuation counter is for counting time during which the battery 4 is held in the charging state during execution of the above-mentioned discharging control process.

In a step 17 following the step 16, it is determined whether or not the count value CT2 of the charge continuation counter is larger than a predetermined value CREF2. If the answer to this question is negative (NO), the step 21 is executed as described above, followed by terminating the present process.

On the other hand, if the answer to the question of the step 17 is affirmative (YES), i.e. if the time during which the battery 4 is held in the charging state has reached a value ΔT·CREF2, it is determined that the actual charge capacity of the battery 4 is less than the estimated charge capacity What, so that the process proceeds to a step 18, wherein to indicate the fact, the low capacity flag F_SC_LOW is set to 1, followed by terminating the present process.

As described above, in the charge capacity determination process, in a case where What>Wobj+WA holds in the power generation control process described with reference to FIG. 2, and the demand voltage VACG is held at the predetermined discharge value Vdschg by execution of the discharging control process, if the battery 4 is in the charging state, it is determined that the actual charge capacity of the battery 4 is less than the estimated charge capacity What, and the low capacity flag F_SC_LOW is set to 1 to indicate the result of the determination.

Next, the estimated charge capacity calculation process executed by the ECU 2 will be described with reference to FIG. 4. This process calculates the above-mentioned estimated charge capacity What, and is executed at the above-mentioned predetermined control period ΔT. Note that in the present embodiment, the estimated charge capacity What corresponds to a charge capacity parameter.

Figure 4:
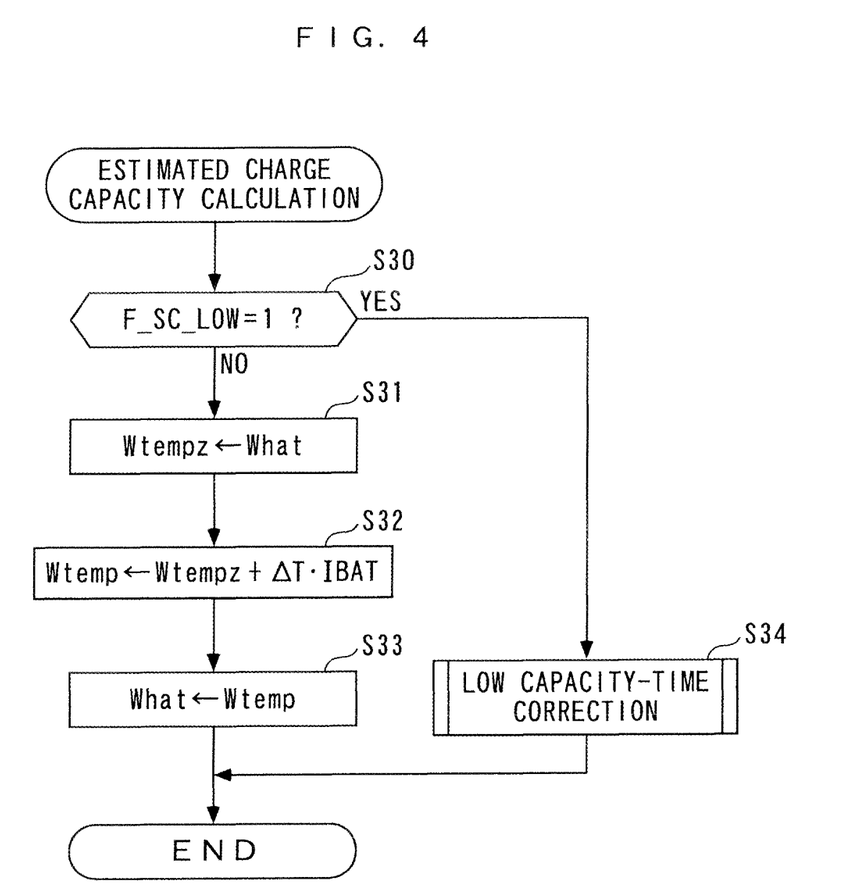
FIG. 4 is a flowchart showing an estimated charge capacity calculation process.

As shown in FIG. 4, first, in a step 30, it is determined whether or not the low capacity flag F_SC_LOW is 1. If the answer to this question is negative (NO), the process proceeds to a step 31, wherein the immediately preceding value Wtempz of a temporary value Wtemp of the estimated charge capacity is set to the estimated charge capacity What stored in the RAM.

Next, the process proceeds to a step 32, wherein the temporary value Wtemp of the estimated charge capacity is set to the sum (Wtempz+ΔT·IBAT) of the immediately preceding value Wtempz and a value ΔT·IBAT. In a step 33 following the step 32, the estimated charge capacity What is set to the temporary value Wtemp, followed by terminating the present process.

On the other hand, if the answer to the question of the step 30 is affirmative (YES), i.e. if it is determined that the actual charge capacity of the battery 4 is less than the estimated charge capacity What, and if the above-described charging control process is being executed, the process proceeds to a step 34, wherein a low capacity-time correction process is executed. The low capacity-time correction process is for correcting the estimated charge capacity What such that it becomes closer to the actual charge capacity of the battery 4, and is executed as shown FIG. 5.

Figure 5:
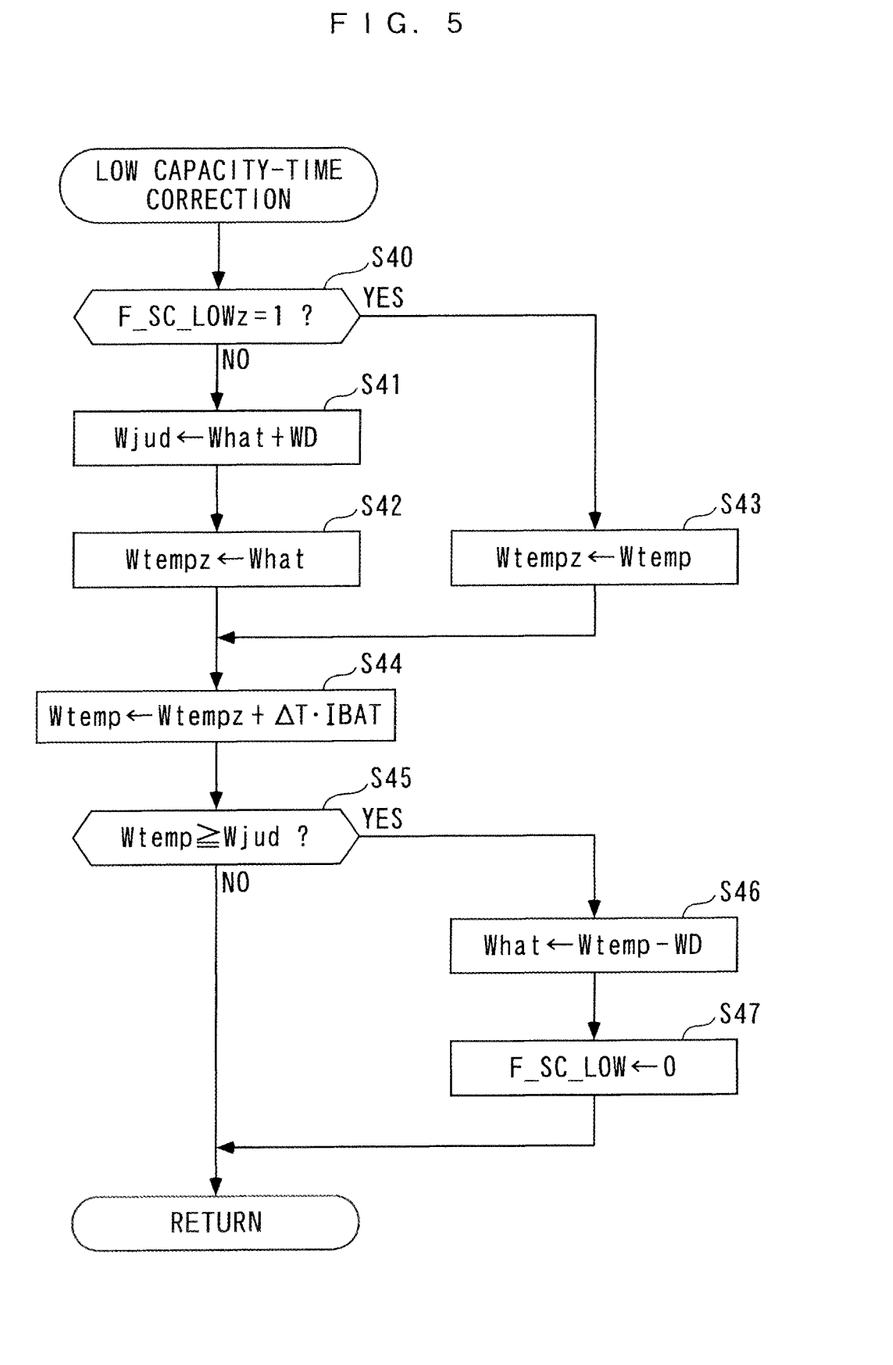
FIG. 5 is a flowchart showing a low-capacity time correction process.

As shown in FIG. 5, first, in a step 40, it is determined whether or not the immediately preceding value F_SC_LOWz of the low capacity flag is 1. If the answer to this question is negative (NO), i.e. if the present control timing is a first execution of the low capacity-time correction process, the process proceeds to a step 41, wherein a reference value Wjud is set to the sum (What+WD) of the estimated charge capacity What stored in the RAM and a predetermined correction term WD. The predetermined correction term WD is set to a relatively small positive predetermined value.

Next, the process proceeds to a step 42, wherein the immediately preceding value Wtempz of the temporary value of the estimated charge capacity is set to the estimated charge capacity Wtemp stored in the RAM.

On the other hand, if the answer to the question of the step 40 is affirmative (YES), i.e. if the present control timing is a second or later execution of the low capacity-time correction process, the process proceeds to a step 43, wherein the immediately preceding value Wtempz of the temporary value of the estimated charge capacity is set to the temporary value Wtemp of the estimated charge capacity, which is stored in the RAM.

In a step 44 following the step 42 or 43, the temporary value Wtemp of the estimated charge capacity is set to the sum (Wtempz+ΔT·BAt) of the immediately preceding value Wtempz and the value ΔT·IBAT.

Next, the process proceeds to a step 45, wherein it is determined whether or not the temporary value Wtemp of the estimated charge capacity is larger than the reference value Wjud. If the answer to this question is negative (NO), the present process is immediately terminated.

On the other hand, if the answer to the question of the step 45 is affirmative (YES), i.e. if Wtemp≥Wjud holds, the process proceeds to a step 46, wherein the estimated charge capacity Wtemp is set to a value (Wtemp−WD) which is calculated by subtracting the correction term WD from the temporary value Wtemp.

Next, the process proceeds to a step 47, wherein since the correction of the estimated charge capacity Wtemp is finished, it is judged that the low capacity-time correction process and the above-described charging control process should be finished and to indicate the fact, the low capacity flag F_SC_LOW is set to 0, followed by terminating the present process.

Referring again to FIG. 4, after the low capacity-time correction process is executed as described above in the step 34, the estimated charge capacity calculation process shown in FIG. 4 terminates.

By executing the above-described low capacity-time correction process, when the actual charge capacity of the battery 4 is estimated to be less than the estimated charge capacity Wtemp, it is possible to make the estimated charge capacity Wtemp closer to the actual charge capacity of the battery 4 by the correction term WD.

Figure 6:
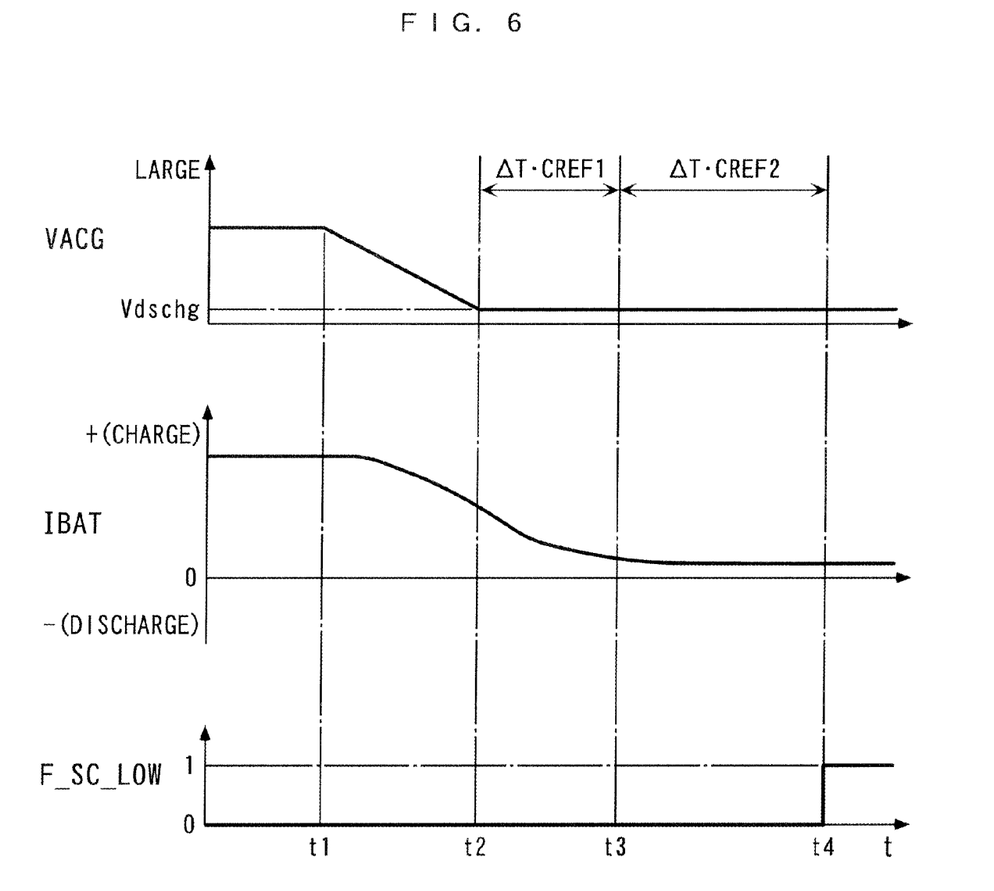
FIG. 6 is a timing chart showing an example of a result of control performed in a case where an actual charge capacity of a battery is less than an estimated charge capacity.

Next, with reference to FIG. 6, an example of results of the control will be described in which the above-described various control processes are executed when the actual charge capacity of the battery 4 is less than the estimated charge capacity Wtemp. As shown in FIG. 6, at time t1, the discharging control process is started, whereafter the demand voltage VACG is gradually reduced to the predetermined discharge value Vdschg, and in accordance therewith, the battery current IBAT is also reduced. At time t2, the demand voltage VACG reaches the predetermined discharge value Vdschg, whereafter the demand voltage VACG is held at the predetermined discharge value Vdschg.

Further, during execution of the discharging control process, with the lapse of time, at a time point (time t3) when the time during which the battery terminal voltage VBAT is held less than the predetermined discharge reference value Vjud has reached the value ΔT·CREF1, the actual charge capacity of the battery 4 become less than the estimated charge capacity Wtemp, which results in IBAT>0, placing the battery 4 in the charging state. Further, with the lapse of time, at a time point (time t4) when the time during which the battery 4 is held in the charging state has reached the value ΔT·CREF2, it is determined that the actual charge capacity of the battery 4 is less than the estimated charge capacity Wtemp, so that the low capacity flag F_SC_LOW is set to 1.

As described above, with the charge capacity parameter estimation system 1 according to the first embodiment, during execution of the discharging control process of the step 6 in FIG. 2, if the answers to the questions of the steps 14 and 17 in FIG. 3 are both affirmative (YES), i.e. in the case where the time during which the demand voltage VACG is held at the predetermined discharge value Vdschg has reached the value ΔT·CREF1, when thereafter, the time during which battery 4 is held in the charging state reaches the value ΔT·CREF2, it is determined that the actual charge capacity of the battery 4 is less than the estimated charge capacity Wtemp, so that the low capacity flag F_SC_LOW is set to 1.

In this case, since the discharging control process is executed when Wtemp>Wobj+WA holds, if the estimated charge capacity Wtemp is equal to or larger than the actual charge capacity of the battery 4, then the battery 4 is controlled to be in the discharging state. In spite of this control, if the battery 4 remains in the charging state, it can be estimated that the actual charge capacity of the battery 4 is less than the estimated charge capacity Wtemp at the time. Thus, it is possible to accurately estimate that the actual charge capacity of the battery 4 is less than the estimated charge capacity Wtemp. Especially, even if the estimated charge capacity Wtemp has a calculation error (deviation) which is significantly larger than the actual charge capacity of the battery 4 due to replacement of the battery 4 or the like, it is possible to accurately estimate such an occurrence of the calculation error.

Further, the charge capacity determination process in FIG. 2 is executed only during execution of the discharging control process, i.e. when Wtemp>Wobj+WA holds, but is not executed when Wtemp≤Wobj+WA holds. This makes it possible to estimate that the actual charge capacity of the battery 4 is less than the estimated charge capacity Wtemp while reducing the range of change in the actual charge capacity of the battery 4.

Further, if it is determined that the actual charge capacity of the battery 4 is less than the estimated charge capacity Wtemp, and the low capacity flag F_SC_LOW is set to 1, in the step 4 of FIG. 2, the charging control process is executed and the low capacity-time correction process of FIG. 5 is executed as well. As a consequence, the charging control process is executed such that the actual charge capacity of the battery 4 is increased by the correction term WD, and at the time point when the charging control process is terminated (at the time point when the answer to the question of the step 45 is affirmative (YES)), the estimated charge capacity Wtemp is corrected such that it is reduced by the correction term WD. This makes it possible to make the estimated charge capacity Wtemp closer to the actual charge capacity of the battery 4 by the correction term WD.

Therefore, in the case where the actual charge capacity of the battery 4 is less than the estimated charge capacity Wtemp, with the progress of control, the charge capacity determination process in FIG. 3 and the low capacity-time correction process in FIG. 5 are executed repeatedly, whereby the estimated charge capacity Wtemp can be gradually made closer to the actual charge capacity of the battery 4 each time by the correction term WD, which makes it possible to improve the calculation accuracy. Especially, as mentioned hereinabove, even if the estimated charge capacity Wtemp has a calculation error significantly larger than the actual charge capacity of the battery 4 due to replacement of the battery 4 or the like, it is possible to gradually reduce such a calculation error with the progress of control.

Figure 7:
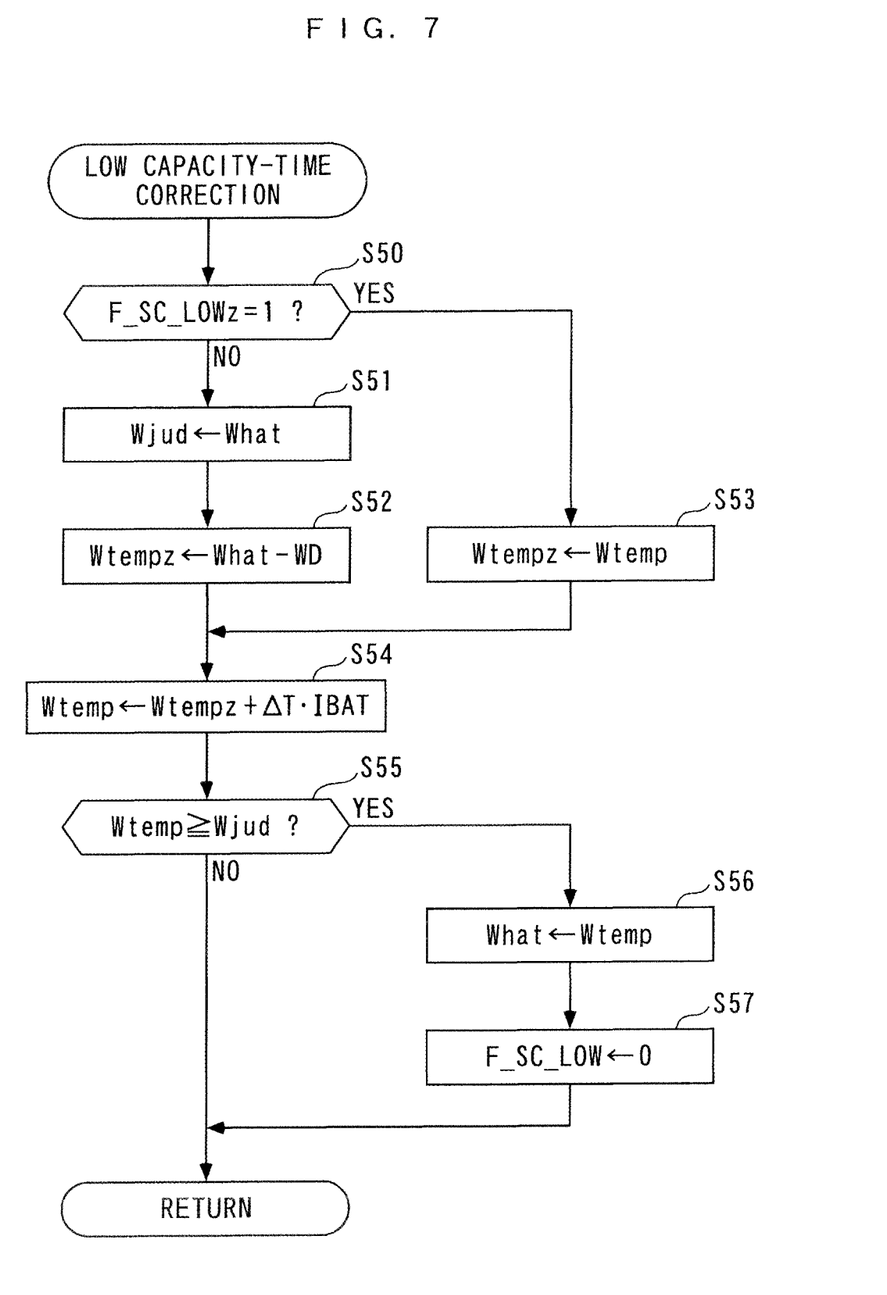
FIG. 7 is a flowchart showing a variation of the low-capacity time correction process.

Note that, the correction process of FIG. 5 as the low capacity-time correction process in the step 34 in FIG. 4 described above may be replaced by a correction process shown in FIG. 7. As apparent from comparison between FIG.

7 and FIG. 5, the correction process in FIG. 7 is identical to the correction process in FIG. 5 except steps 51, 52 and 56, and hence the following description is given mainly of different points, and description of the other points will be omitted.

As shown in FIG. 7, first, if the answer to the question of a step 50 is negative (NO), in the step 51, the reference value Wjud is set to the estimated charge capacity What stored in the RAM. Next, in the step 52, the immediately preceding value Wtempz of the temporary value of the estimated charge capacity is set to a value (What−WD) which is calculated by subtracting the correction term WD from the estimated charge capacity What stored in the RAM.

Further, if the answer to the question of a step 55 is affirmative (YES), the process proceeds to the step 56, wherein the estimated charge capacity What is set to the temporary value Wtemp. Next, in a step 57, similarly to the above-mentioned step 47, the low capacity flag F_SC_LOW is set to 0, followed by terminating the present process.

Also in the case where the low capacity-time correction process in FIG. 7 is executed as described above, it is possible to obtain the same advantageous effects as obtained in the case where the low capacity-time correction process in FIG. 5 is executed. More specifically, when the actual charge capacity of the battery 4 is estimated to be less than the estimated charge capacity What, it is possible to make the estimated charge capacity What closer to the actual charge capacity of the battery 4 by the correction term WD.

Although in the first embodiment, the battery 4 of lead-acid type is used as the electric storage device, by way of example, the electric storage device according to the present invention is not limited to this, but any device may be used insofar as it can charge and discharge. For example, a rechargeable battery, a super capacitor, or the like, which can charge and discharge, may be used as the electric storage device.

Further, although in the first embodiment, the estimated charge capacity What is used as a charge capacity parameter, by way of example, the charge capacity parameter of the present invention is not limited to this, but any parameter may be used insofar as it indicates a charge capacity of the electric storage device. For example, a value which is calculated by subtracting the estimated charge capacity What from the maximum charge capacity of the electric storage device as a chargeable limit, may be used as the charge capacity parameter. Further, the charge level SOC or a value which is calculated by subtracting the charge level SOC from a value 100 may be used as the charge capacity parameter. In this case, it is only required that the charge level SOC is calculated based on the estimated charge capacity What.

Further, although in the first embodiment, the ECU 2 is used as a control device, by way of example, the control device of the present invention is not limited to this, but any device may be used insofar as it can control charging and discharging operations of the electric storage device. For example, a control circuit may be used as the control device.

On the other hand, although in the first embodiment, the power generator 5 of alternating current type is used as the power generator, by way of example, the power generator of the present invention is not limited to this, but any generator may be used insofar as the generated voltage thereof can be controlled. For example, a power generator of direct current type may be used as the power generator.

Further, although in the first embodiment, the auxiliary equipment 6 mounted on a vehicle is used as an electric device, by way of example, the electric device of the present invention is not limited to this, but any device may be used insofar as it works by power supply. For example, a device incorporating an electric motor or an electromagnetic actuator may be used as the electric device.

Further, although in the first embodiment, the sensor unit 3 is used as charging/discharging state detection means, by way of example, the charging/discharging state detection means of the present invention is not limited to this, but any charging/discharging state detection means may be used insofar as it can detect a charging/discharging state. For example, an electric current sensor which detects electric current may be used as the charging/discharging state detection means.

Next, a charge capacity parameter estimation system according to a second embodiment of the present invention will be described. The charge capacity parameter estimation system of the present embodiment is identical in respect of the mechanical and electrical arrangement to the charge capacity parameter estimation system according to the first embodiment, and only details of the control processes are different. Therefore, the following description is mainly given of different points. Further, the same components as those of the first embodiment are denoted by the same reference numerals and description thereof is omitted.

The charge capacity parameter estimation system comprises a ECU 2, and the ECU 2 executes, as the power generation control process, a control process is executed which is obtained by omitting the step 1 from the above-described power generation control process in FIG. 2, but the above-described charge capacity determination process in FIG. 3 is not executed. Further, the ECU 2 executes, as the estimated charge capacity calculation process, a calculation process shown in FIG. 8 is executed at the above-mentioned predetermined control period $\Delta T$ instead of the above-described calculation process in FIG. 4.

Figure 8:
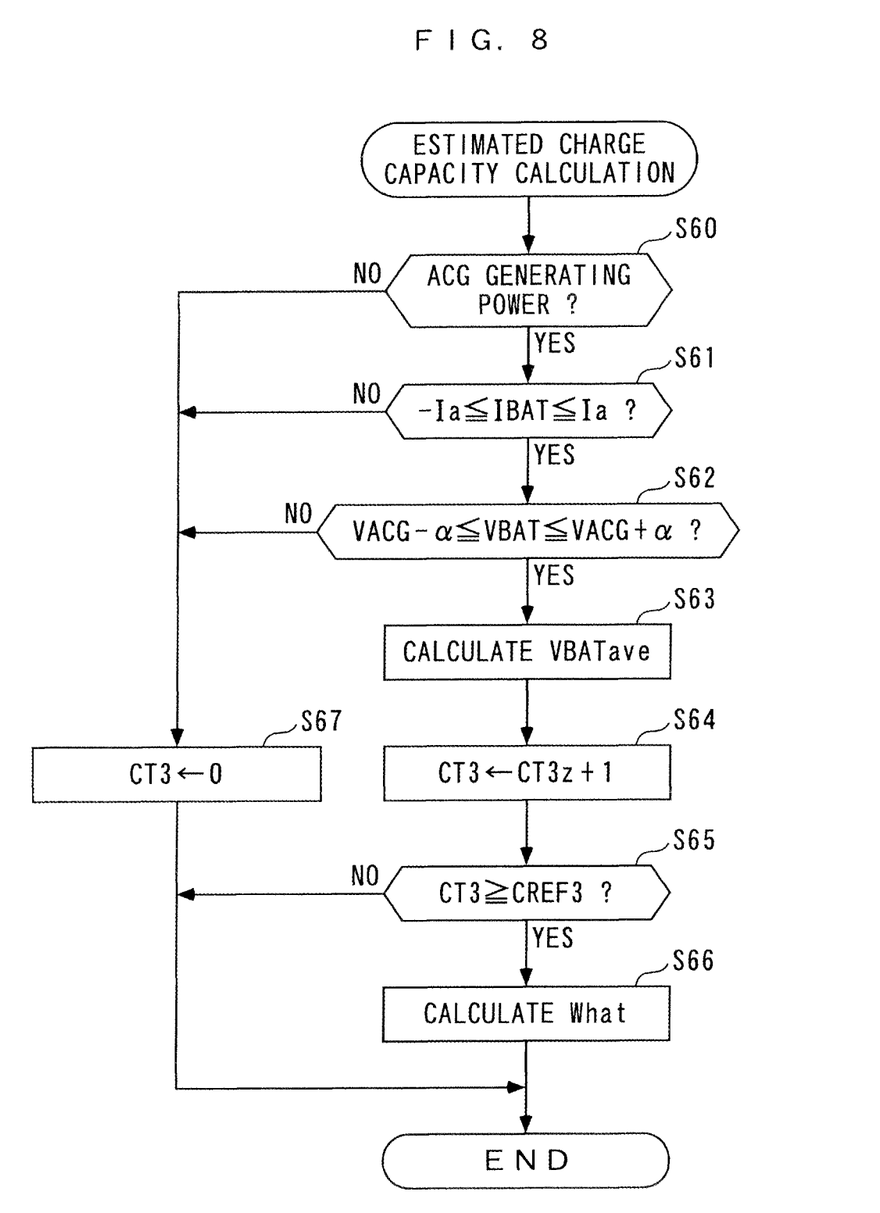
FIG. 8 is a flowchart showing an estimated charge capacity calculation process by a charge capacity parameter estimation system for an electric storage device, according to a second embodiment of the present invention.

More specifically, as shown in FIG. 8, first, in a step 60, it is determined whether or not the power generator 5 is generating electric power. If the answer to this question is negative (NO), the process proceeds to a step 67, wherein a count value CT3 of a calculation condition counter is set to 0, followed by terminating the present process. On the other hand, if answer to the question of the step 60 is affirmative (YES), the process proceeds to a step 61, wherein it is determined whether or not −Ia≤IBAT≤Ia holds. If the answer to this question is negative (NO), the step 67 is executed as described above, followed by terminating the present process.

On the other hand, if the answer to the question of the step 61 is affirmative (YES), i.e. if the battery current IBAT is close to 0, the process proceeds to a step 62, wherein it is determined whether or not VACG−α≤VBAT≤VACG+α holds. The value α is a positive predetermined value, and the step 62 is for determining whether or not load of auxiliary equipment 6 is in an unstable state (suddenly decreasing or suddenly increasing state).

If the answer to the question of the step 62 is negative (NO), i.e. if the load of the auxiliary equipment 6 is in an unstable state, then the step 67 is executed, followed by terminating the present process. On the other hand, if the answer to the question of the step 62 is affirmative (YES), i.e. if the load of the auxiliary equipment 6 is in a stable state, the process proceeds to a step 63, wherein an average value VBATave of an battery terminal voltage is calculated. The average value VBATave is calculated by the moving average method using a predetermined number of values of the battery terminal voltage VBAT.

In a step 64 following the step 63, the count value CT3 of the calculation condition counter is set to the sum (CT3z+1) of the immediately preceding value CT3z thereof and 1. That is, the count value CT3 of the calculation condition counter is incremented by 1. The calculation condition counter is for counting a duration of time during which the calculation conditions of the estimated charge capacity What are satisfied (duration of time during which all of the answers to the questions of the above-described steps 60 to 62 are affirmative (YES)).

Next, the process proceeds to a step 65, wherein it is determined whether or not the count value CT3 of the calculation condition counter is larger than a predetermined value CREF3. If the answer to this question is negative (NO), the present process is immediately terminated.

Figure 9:
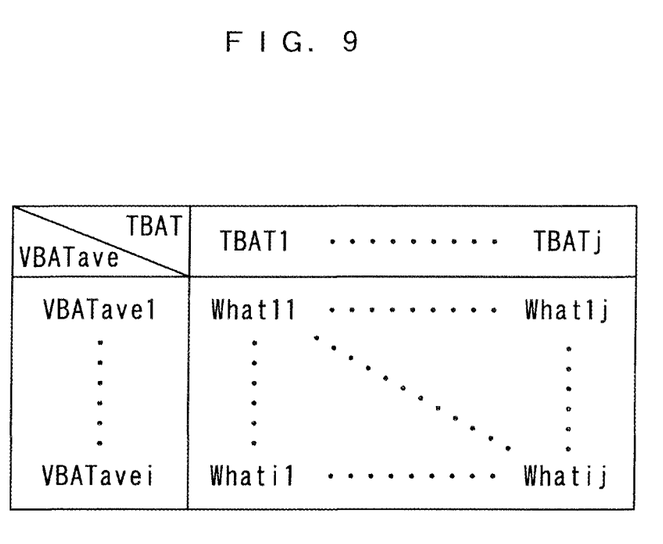
FIG. 9 is a diagram showing an example of a map used for calculating the estimated charge capacity.

On the other hand, if the answer to the question of the step 65 is affirmative (YES), i.e. if the duration of time during which the calculation conditions of the estimated charge capacity What are satisfied has reached a value $\Delta T \cdot CREF3$, the process proceeds to a step 66, wherein the estimated charge capacity What is calculated according to the average value VBATave of the battery terminal voltage and the battery temperature TB, by searching a map shown in FIG. 9. In FIG. 9, i and j are positive integers. As described above, the estimated charge capacity What is calculated in the step 66, followed by terminating the present process.

Note that, in the present embodiment, the ECU2 corresponds to the control device and the estimation means, the sensor unit 3 corresponds to an electric current detecting-means and voltage detecting-means. Further, the battery current IBAT corresponds to electric current which flows during charging and discharging operations of the electric storage device, and the battery terminal voltage VBAT and the average value VBATave of the battery terminal voltage correspond to a voltage of the electric storage device. Further, the map of FIG. 9 corresponds to a correlation model which represents a correlation between the voltage of the electric storage device and the charge capacity parameter, and the estimated charge capacity What corresponds to the charge capacity parameter.

As described above, with the charge capacity parameter estimation system according to the second embodiment, when the battery current IBAT is held in a predetermined range ($-Ia \leq IBAT \leq Ia$) close to 0 by the power generation control process, the average value VBATave of the battery terminal voltage is calculated, and when the time during which the battery current IBAT is held close to 0 has continued for $\Delta T \cdot CREF3$, the estimated charge capacity What is calculated according to the average value VBATave of the battery terminal voltage and the battery temperature TB, by searching the map shown in FIG. 9. In this case, since the battery terminal voltage VBAT at the time of the battery current IBAT being held close to 0 can be regarded as close to an open circuit voltage of the battery 4, and hence, by using such average value VBATave of the battery terminal voltage VBAT, it is possible to accurately calculate the estimated charge capacity What even during power generation of the power generator 5.

Note that although the second embodiment is an example in which the map in FIG. 9 is used as a correlation model which represents the correlation between the voltage of the electric storage device and the charge capacity parameter, the correlation model of the present invention is not limited to this, but any correlation model may be used insofar as it can represent the correlation between the voltage of the electric storage device and the charge capacity parameter. For example, as the correlation model, a mathematical formula which defines a relationship between the voltage of the electric storage device and the charge capacity parameter may be used, or a combination of the mathematical formula and the map may be used.

It is further understood by those skilled in the art that the foregoing are preferred embodiments of the invention, and that various changes and modifications may be made without departing from the spirit and scope thereof.

What is claimed is:

1. A charge capacity parameter estimation system which estimates a charge capacity parameter indicative of a charge capacity of an electric storage device that is electrically connected to a power generator of which a generated voltage is controlled by a control device, and to an electric device to which generated voltage is supplied from the power generator, the electric storage device being controlled in respect of a charging operation from the power generator and a discharging operation to the electric device according to the charge capacity parameter indicative of the charge capacity, through control of the generated voltage of the power generator by the control device, the charge capacity parameter estimation system comprising:
charging/discharging state detection means for detecting a charging/discharging state of the electric storage device; and
estimation means for estimating that an actual charge capacity of the electric storage device is less than the charge capacity indicated by the charge capacity parameter, when the charging state of the electric storage device is detected, in a case where the generated voltage of the power generator is controlled such that the electric storage device executes the discharging operation to the electric device.

2. The charge capacity parameter estimation system as claimed in claim 1,
wherein when said estimation means estimates that the actual charge capacity of the electric storage device is less than the charge capacity indicated by the charge capacity parameter, the control device executes charging control for controlling the generated voltage of the power generator, such that the charge capacity indicated by the charge capacity parameter is increased by a predetermined value through the charging operation to the electric storage device, and
wherein when the charging control is terminated, said estimation means corrects the charge capacity parameter such that the charge capacity indicated by the charge capacity parameter is reduced by the predetermined value.

3. The charge capacity parameter estimation system as claimed in claim 1,
wherein when said estimation means estimates that the actual charge capacity of the electric storage device is less than the charge capacity indicated by the charge capacity parameter, said estimation means corrects the charge capacity parameter such that the charge capacity indicated by the charge capacity parameter is reduced by the predetermined value, and
wherein when said estimation means executes the correction of the charge capacity parameter, the control device controls the generated voltage of the power generator such that the charge capacity indicated by the charge capacity parameter is increased by the predetermined value through the charging operation to the electric storage device.

4. A charge capacity parameter estimation system which estimates a charge capacity parameter indicative of a charge capacity of an electric storage device that is electrically connected to a power generator of which a generated voltage is controlled by a control device, and to an electric device to which generated voltage is supplied from the power generator, the electric storage device being controlled in respect of a charging operation from the power generator and a discharging operation to the electric device, through control of the generated voltage of the power generator by the control device, the charge capacity parameter estimation system comprising:

current detection means for detecting a current flowing during a charging/discharging operation of the electric storage device;

voltage detection means for detecting a voltage of the electric storage device; and estimation means for estimating the charge capacity parameter, using a correlation model representing a correlation between the voltage of the electric storage device and the charge capacity parameter, based on the voltage of the electric storage device detected when the current flowing to or from the electric storage device is held in a predetermined range around 0 by the control of the generated voltage of the power generator.

* * * * *